United States Patent
Jang et al.

(10) Patent No.: US 9,899,976 B2
(45) Date of Patent: Feb. 20, 2018

(54) COMPACT CHIREIX COMBINER AND IMPEDANCE MATCHING CIRCUIT

(71) Applicant: Infineon Technologies Americas Corp., El Segundo, CA (US)

(72) Inventors: Haedong Jang, San Jose, CA (US); Richard Wilson, Morgan Hill, CA (US); Timothy Canning, Morgan Hill, CA (US); David Seebacher, Villach (AT); Bayaner Arigong, San Jose, CA (US); Frank Trang, San Jose, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 15/185,786

(22) Filed: Jun. 17, 2016

(65) Prior Publication Data

US 2017/0366148 A1 Dec. 21, 2017

(51) Int. Cl.
*H03F 3/21* (2006.01)
*H03F 3/60* (2006.01)
*H03F 3/193* (2006.01)

(52) U.S. Cl.
CPC ............. *H03F 3/604* (2013.01); *H03F 3/193* (2013.01); *H03F 3/21* (2013.01);
(Continued)

(58) Field of Classification Search
CPC .................................. H03F 3/604; H03F 3/21
(Continued)

(56) References Cited

U.S. PATENT DOCUMENTS

| 8,180,303 | B2 * | 5/2012 | Dupuy ................ H03F 1/0222 330/295 |
| 2008/0125061 | A1 * | 5/2008 | Kuriyama ............ H03F 1/0205 455/127.1 |

(Continued)

OTHER PUBLICATIONS

Barton, Taylor W. et al., "An RF-input Outphasing Power Amplifier with RF Signal Decomposition Network", 2015 IEEE MTT-S International Microwave Symposium, Phoenix, AZ, May 2015, pp. 1-4.

(Continued)

*Primary Examiner* — Patricia T Nguyen
(74) *Attorney, Agent, or Firm* — Murphy, Bilak & Homiller, PLLC

(57) ABSTRACT

A power amplifier includes an outphasing amplifier. The outphasing amplifier includes a first amplifier and a second amplifier, and is configured to provide a first amplified RF signal and a second amplified RF signal that is phase shifted from the first amplified RF signal. The power amplifier further includes an output circuit that is configured to combine RF power of the first and second amplified RF signals at a summing node. The output circuit includes a first branch connected between the first amplifier and a summing node and a second branch connected between the second amplifier and the summing node. The first and second branches are each configured to match an output impedance of the first and second amplifiers and to phase shift the first and second amplified RF signals for an outphasing operation using common reactive components for the match of the output impedance and the outphasing operation.

20 Claims, 6 Drawing Sheets

(52) U.S. Cl.
CPC .. *H03F 2200/225* (2013.01); *H03F 2200/391* (2013.01); *H03F 2200/451* (2013.01)

(58) Field of Classification Search
USPC ........................................................ 330/286
See application file for complete search history.

(56) References Cited

U.S. PATENT DOCUMENTS

| | | | | |
|---|---|---|---|---|
| 2010/0301968 | A1* | 12/2010 | Shirakawa | H03H 9/02228 333/189 |
| 2012/0105147 | A1* | 5/2012 | Harris | H03F 1/56 330/57 |
| 2013/0135053 | A1* | 5/2013 | Tamanoi | H03F 1/56 330/296 |
| 2015/0303961 | A1* | 10/2015 | Banerjee | H03F 3/211 375/287 |
| 2016/0181990 | A1* | 6/2016 | Ahmed | H03F 1/0266 330/296 |

OTHER PUBLICATIONS

Barton, Taylor W. et al., "Four-Way Microstrip-Based Power Combining for Microwave Outphasing Power Amplifiers", IEEE Transactions on Circuits and Systems I: Regular Papers, vol. 61, Issue 10, May 30, 2014, pp. 1-12.

Calvillo-Cortes, David A. et al., "A Package-Integrated Chireix Outphasing RF Switch-Mode High-Power Amplifier", IEEE Transactions on Microwave Theory Techniques, vol. 61, No. 10, Oct. 2013, pp. 3721-3732.

Chireix, H., "High Power Outphasing Modulation", Proceedings of the Institute of Radio Engineers, vol. 23, Issue 11, Nov. 1935, pp. 1370-1392.

Doherty, W H., "A New High-Efficiency Power Amplifier for Modulated Waves", Bell Telephone System Technical Publications, Annual Convention of the Institute of Radio Engineers, Cleveland, Ohio, Jul. 1936, pp. 1-22.

Gerhard, Walter et al., "Novel Transmission Line Combiner for Highly Efficient Outphasing RF Power Amplifiers", Microwave Integrated Circuit Conference, 2007, EuMIC 2007, European, Munich, Germany, Oct. 2007, pp. 1433-1436.

Jang, Haedong et al., "Self-Outphasing Chireix Power Amplifier Using Device Input Impedance Variation", Microwave Symposium Digest (MTT), 2016 IEEE MTT-S International, May 2016, pp. 1-4.

Raab, Frederick H., "Efficiency of Outphasing RF Power-Amplifier Systems", IEEE Transactions on Communications, vol. 33, Issue 10, Oct. 1985, pp. 1094-1099.

Van Der Heijden, Mark P. et al., "A 19W High-Efficiency Wide-Band CMOS-GaN Class-E Chireix RF Outphasing Power Amplifier", Microwave Symposium Digest (MTT), 2011 IEEE MTT-S International, Baltimore, MD, Jun. 2011, pp. 1-4.

\* cited by examiner

COMPACT CHIREIX COMBINER AND IMPEDANCE MATCHING CIRCUIT

FIELD OF TECHNOLOGY

The present application relates to RF (radio frequency) amplifier circuits, and in particular relates to outphasing amplifier designs.

BACKGROUND

RF power amplifiers are used in a variety of applications such as base stations for wireless communication systems etc. The signals amplified by the RE power amplifiers often include signals that have a high frequency modulated carrier having frequencies in the 400 megahertz (MHz) to 4 gigahertz (GHz) range. The baseband signal that modulates the carrier is typically at a relatively lower frequency and, depending on the application, can be up to 300 MHz or higher.

RF power amplifiers are designed to provide linear operation without distortion. RF transistors may have low input and output impedances (e.g., around 1 ohm or less for high power devices). Input and output impedance matching circuits are used to match the input and output impedances of the RE transistors to impedance matching networks from an external device, such as a circuit board.

A device package for an RE power amplifier can include a transistor die (e.g., MOSFET (metal-oxide semiconductor field-effect transistor), LDMOS (laterally-diffused metal-oxide semiconductor), HEMT (high electron mobility transistor), along with an input and output impedance matching circuit incorporated therein. The input and output impedance matching circuits typically include LC networks that provide at least a portion of an impedance matching circuit that is configured to match the impedance of the transistor die to a fixed value. The device package may also include tuning circuits that are configured to filter out higher order harmonic components of the fundamental frequency to improve amplifier efficiency.

A Chireix amplifier is one type of RF power amplifier that is gaining increased attention and popularity. The Chireix amplifier was first proposed by H. Chireix in 1935, and is described in "High power outphasing modulation," Proc. IRE, Vol. 23, No. 11, pp. 1370-1392, November 1935, the content of which is incorporated by reference in its entirety. A Chireix amplifier utilizes an outphasing technique to amplify two phase-shifted constant envelope signals. The Chireix amplifier offers highly efficient and linear amplification without distortion. However, one source of inefficiency in a Chireix amplifier is attributable to the relative complexity of the output circuitry. Conventional Chireix amplifier designs that include impedance matching circuits and power combiner circuitry require a substantial number of components that can degrade efficiency and performance, and introduce substantial phase delay in the amplified signal.

SUMMARY

A power amplifier is disclosed. According to an embodiment, the power amplifier includes an outphasing amplifier. The outphasing amplifier includes a first amplifier with a first output terminal and a second amplifier with a second output terminal. The outphasing amplifier is configured to provide a first amplified RF signal at the first output terminal and a second amplified RF signal at the second output terminal. The second amplified RF signal has the same frequency and is phase shifted from the first amplified RF signal. The power amplifier further includes an output circuit that is configured to combine RF power of the first and second amplified RF signals at a summing node. The output circuit includes a first branch connected between the first output terminal and the summing node. The first branch is configured to match an output impedance of the first amplifier to a fixed impedance value and to phase shift the first amplified RF signal for an outphasing operation using common reactive components for the match of the output impedance and the outphasing operation. The output circuit further includes a second branch connected between the second output terminal and the summing node. The second branch is configured to match an output impedance of the second amplifier to a fixed impedance value and to phase shift the second amplified RF signal for an outphasing operation using common reactive components for the match of the output impedance and the outphasing operation.

A Chireix combiner circuit that is configured to combine RF power from first and second amplified RF signals that are equal in magnitude and opposite in phase is disclosed. The Chireix combiner includes first and second input ports, and a summing node. The Chireix combiner further includes a first branch connected between the first input port and the summing node. The first branch included a first LC network and a first impedance matching network. The first impedance matching network is configured to match an input impedance of the first branch to a fixed value. The first impedance matching network and the first LC network are collectively configured to phase shift the first amplified RF signal for an outphasing operation using common reactive components for the match of the input impedance of the first branch and the outphasing operation. The Chireix combiner further includes a second branch connected between the second input port and the summing node. The second branch includes a second LC network and a second impedance matching network. The second impedance matching network is configured to match an input impedance of the second branch to a fixed value. The second impedance matching network and the second LC network are collectively configured to phase shift the second amplified RF signal for an outphasing operation using common reactive components for the match of the input impedance of the second branch and the outphasing operation.

A method of amplifying an RF signal is disclosed. According to an embodiment, the method includes, separating and amplifying the RF signal using first and second amplifiers into first and second amplified RE signals, the second amplified RE signal having the same frequency and being phase shifted from the first amplified RE signal. The method further feeding the first and second amplified RE signals into a combiner circuit. The combiner circuit includes a first branch connected between a first output terminal of the first amplifier and a summing node and a second branch connected between a second output terminal of the second amplifier and the summing node. The first branch includes a first LC network and a first output matching network being configured to match an input impedance of the first branch to an output impedance of the first amplifier. The second branch includes a second LC network and a second output matching network being configured to match an input impedance of the second branch to an output impedance of the second amplifier. The method further includes combining RF power from the first and second amplified RE signals into the summing node using the combiner circuit. Combining the RE power includes phase shifting the first amplified RE signal for an outphasing operation between the first output node and the summing node using the first LC network and the first output matching network and phase shifting the second amplified RE signal for an outphasing operation between the second output node and the summing node using the second LC network and the second output matching network.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Embodiments described herein include an outphasing amplifier and an output circuit for the outphasing amplifier. The output circuit performs provides power combination and impedance matching with minimal component count and phase shift. According to an embodiment, the output circuit has two branches that feed into a summing node. Each branch receives first and second amplified RF signals that are phase shifted from one another. Each branch includes an LC network and an impedance matching network. The LC network and the impedance matching network serve a dual purpose. First, the LC network matches an output impedance of the power amplifiers to a fixed value. The LC network may also tune out resonant frequency components for increased efficiency. Second, the LC network provides the phase shift and efficiency compensation reactance for a Chireix combiner so as to provide a Chireix modulated load response. Typically, Chireix combiner circuits require phase shift circuitry (e.g., ¼ wave transmission lines) to properly combine the RF power of phase modulated signals. In this case, the output circuit uses the inherent phase shift provided by a high pass matching network topology to provide the necessary phase shift. By combining the functionality of the circuits in this way, there is a minimal phase shift (e.g., ninety degrees) between the amplifier output and the summing node.

Figure 1:
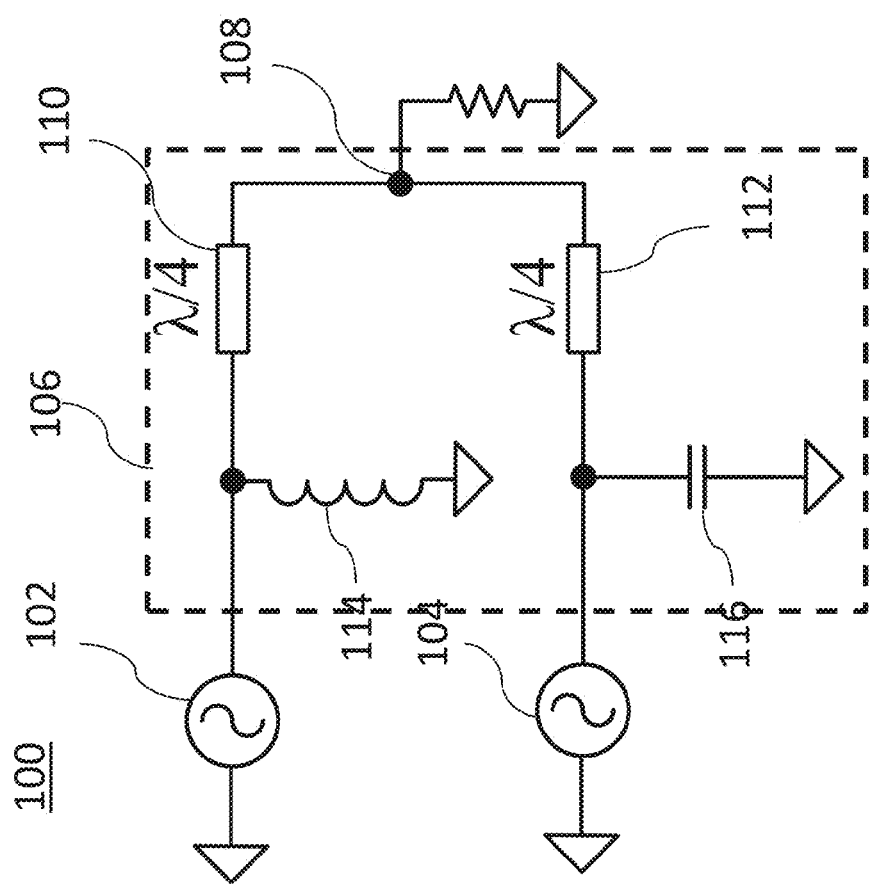
FIG. 1 depicts a partial view of a Chireix amplifier, according to an embodiment.

Referring to FIG. 1, a Chireix amplifier circuit 100 is depicted, according to an embodiment. The Chireix amplifier circuit 100 generates two amplified RE signals 102, 104 that are phase shifted from one another. The phase shift varies as function of signal amplitude of an input signal. According to an embodiment, the phase difference between amplified RF signals 102, 104 is two times of inverse cosine function of the signal amplitude of the input signal.

A combiner circuit 106 feeds the two amplified RF signals 102, 104 into a summing node 108 and is configured to provide an RF signal with the combined power of the two amplified RF signals at the summing node 108. The combiner circuit 106 includes two quarter wave length transmission lines 110, 112. The quarter wave length transmission lines 110, 112 are tuned to a center frequency of the amplified RE signals. The combiner circuit 106 further includes an efficiency compensation inductor 114 that is arranged in a shunt configuration with respect to the first branch of the combiner circuit 106. The combiner circuit 102 further includes an efficiency compensation capacitor 116 that is arranged in a shunt configuration with reference to the second branch of the combiner circuit 106. The efficiency compensation inductor and the efficiency compensation capacitor improve back-off efficiency of the Chireix amplifier circuit 100, as described in F. H. Raab, "Efficiency of outphasing RE power-amplifier systems," IEEE Trans. On communications, Vol. Com-33, No. 10, pp. 1094-1099, October 1985, the content of which is incorporated by reference in its entirety.

Figure 2:
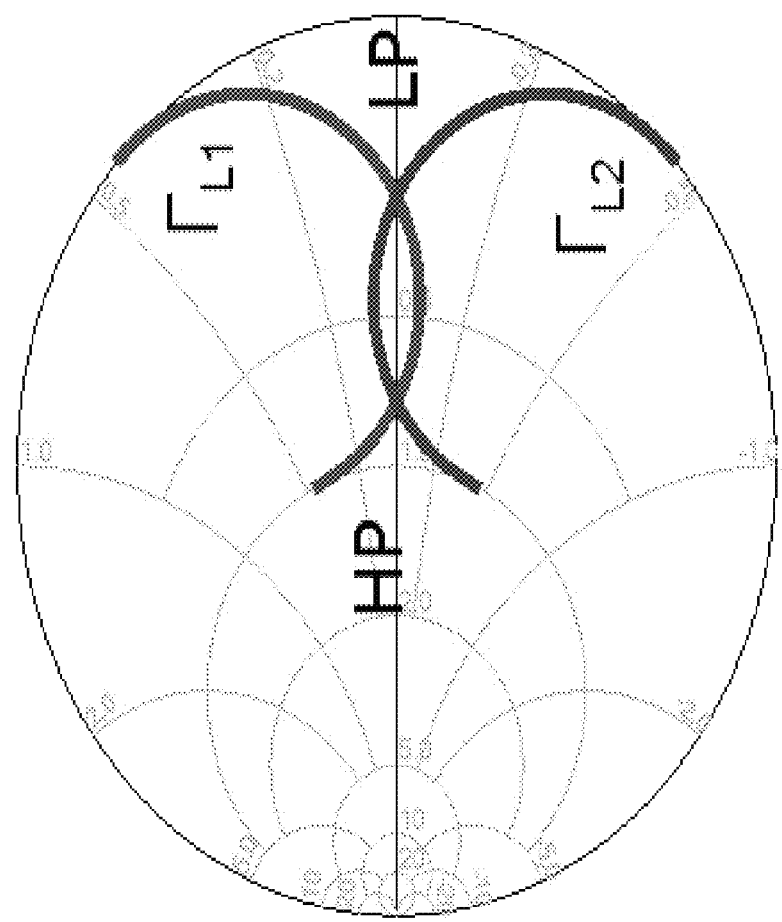
FIG. 2 depicts a nominal Chireix combiner load modulated impedance response, according to an embodiment.

Referring to FIG. 2, a nominal impedance response for the Chireix combiner circuit 106 is depicted in smith chart format. The impedance response is shown for a power back off from a high power (HP) (e.g., full power) level to a low power level (LP). Such an impedance response is referred to a load modulated impedance in that the impedance presented varies depending on the power level of the amplified RE signals.

Figure 3:
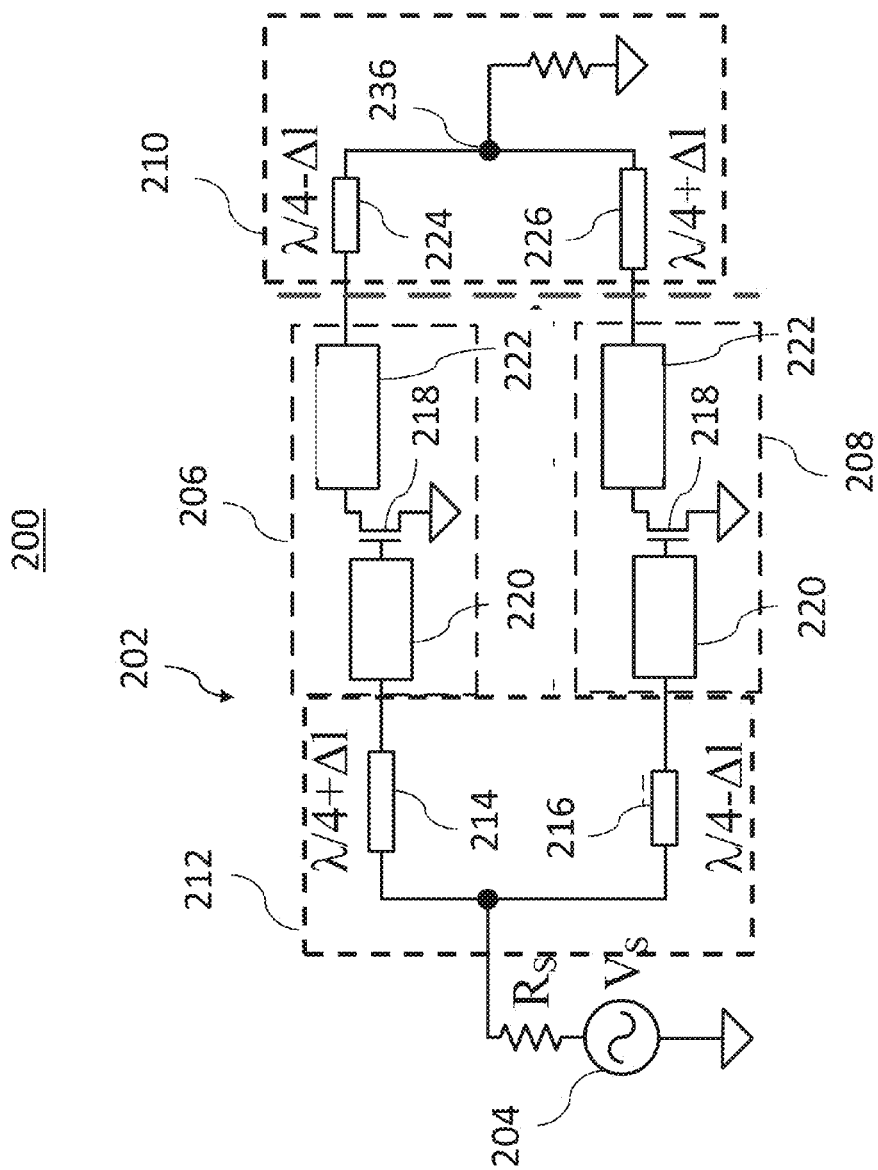
FIG. 3 depicts schematic of a Chireix amplifier including a signal component separator, power amplifiers, and Chireix combiner, according to an embodiment.

Referring to FIG. 3, a power amplifier circuit 200 is depicted, according to an embodiment. The power amplifier circuit 200 can be configured as an outphasing amplifier, and more particularly can be configured as a Chireix amplifier. The power amplifier circuit 200 includes an outphasing amplifier circuit 202 that separates and amplifies an RF signal 204 using first and second amplifiers power 206, 208 into first and second amplified RF signals and a combiner circuit 210 that reconstructs the first and second amplified RF signals into a single, amplified signal.

The outphasing amplifier circuit 202 includes a signal component separator 212 and first and second amplifiers power 206, 208. The signal component separator 212 receives the RF signal 204 (e.g., an AM signal) and splits the RF signal 204 into first and second RF signals that are identical in frequency and amplitude. The signal component separator 212 includes two non-identical quarter wave transmission lines 214, 216. The two non-identical quarter wave transmission lines 214, 216 can be designed with respect to a center frequency of the RF signal 204.

The first and second RF signals are fed from outputs of the signal component separator 212 to the inputs of the first and second power amplifiers 206, 208. The first and second power amplifiers 206, 208 each include an amplifier device 218 as well as an input matching circuit 220 and an output matching circuit 222. According to an embodiment, the first and second power amplifiers 206, 208 are provided as discrete packaged devices. Each of these discrete packaged devices can be designed to be universally compatible with an interface circuit, e.g., a printed circuit board.

The signal component separator 212 in conjunction with the input matching circuits 220 of the first and second amplifiers power 206, 208 provide a phase shift for the first and second RF signals according to a Chireix function.

The amplifier devices 218 are configured to amplify an RF signal as between an input terminal and an output terminal. In various embodiments, the amplifier devices can be a power transistor such as a MOSFET (metal-oxide semiconductor field-effect transistor), DMOS (double-diffused metal-oxide semiconductor) transistor, GaN HEMT (gallium nitride high electron mobility transistor), GaN MESFET (gallium nitride metal-semiconductor field-effect transistor), LDMOS transistor, etc. and more generally any type of RF transistor device. The amplifier devices 218 and the power amplifiers 206, 208 can be a multi-carrier amplifier, a multiband amplifier, an LTE (long term evolution) compliant amplifier, a WCDMA (wideband code division multiple access) compliant amplifier, an 802.11(x) compliant amplifier, etc.

The input matching circuits 220 interface between the input terminals of the amplifier devices 218 (e.g., the gate terminals) and the input terminals of the power amplifiers 206, 208 (e.g., the RF input leads). The output matching circuits 222 interface between the output terminals of the amplifier devices 218 (e.g., the drain terminals) and the output terminals of the power amplifiers 206, 208 (e.g., the RF output leads). The amplifier devices 218 typically have low input and output impedances (e.g., around 1 ohm or less for high power devices). The input and output matching circuits 220, 222 are used to match the input and output impedances of the amplifier devices 218 to the impedance matching networks of an external device, such as a circuit board. In this way, the circuits are balanced for optimal power transmission. Typically, the input and output matching circuits 220, 222 include a network of reactive components (i.e., capacitors and inductors) that are tailored to achieved a desired impedance (e.g., an optimum power transfer value) at a center frequency of the first and second RF signals. These reactive components may be provided by discrete chip capacitors and inductive bond wires that are incorporated into the design of the package the first and second power amplifiers 206, 208. In addition, or in the alternative, these reactive components may be provided on a printed circuit board that is external to the package.

First and second amplified RF signals that are generated by the amplifier devices 218 are fed from the outputs first and second power amplifiers 206, 208 into input ports of the power combiner circuit 210. The power combiner circuit 210 is configured to provide a Chireix combiner impedance response, e.g., as described with reference to FIG. 2, and may have a circuit topology that is substantially similar or identical to the topology of the combiner circuit 106 described with reference to FIG. 1. The power combiner circuit 210 utilizes two non-identical quarter wave transmission lines 224, 226 that are tuned to provide an opposite phase shift as the counterpart quarter wave transmission lines 214, 216 in the signal component separator 212.

Figure 4:
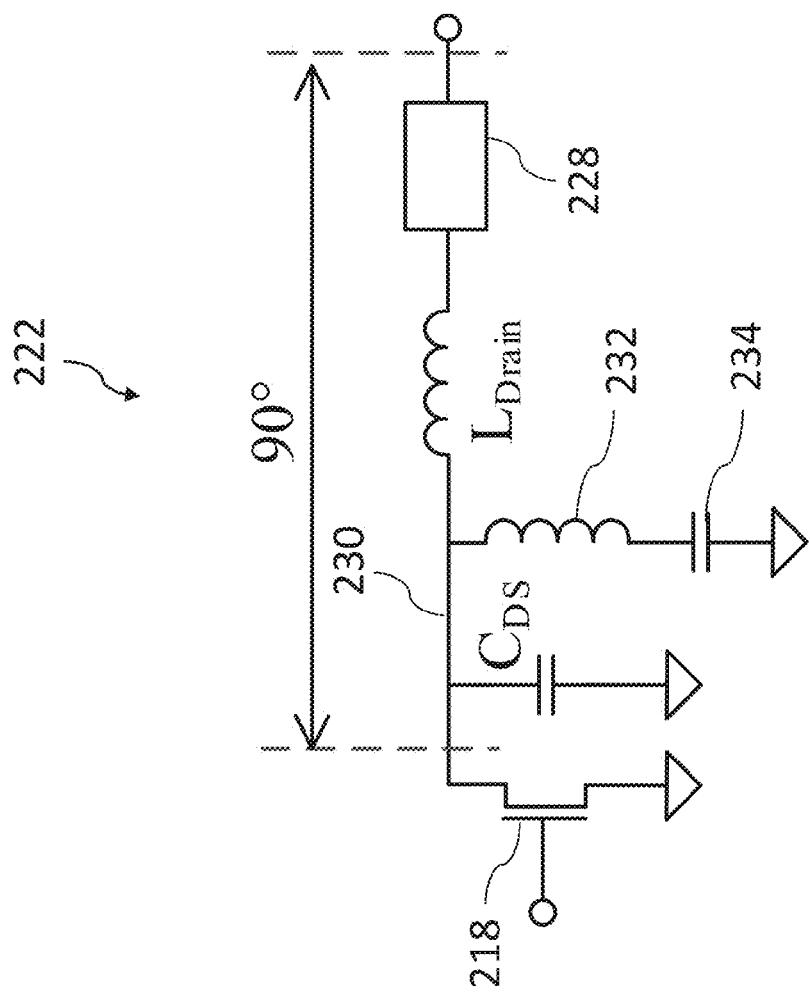
FIG. 4 depicts an output matching circuit that includes an impedance matching circuit and a resonant filtering circuit, according to an embodiment.

Referring to FIG. 4, a more detailed view of one of the output matching circuits 222 is shown. The output matching circuit 222 includes an output impedance matching network 228. The output impedance matching network 228 includes a transmission line and number of reactive components that are configured to match parasitic impedance of the amplifier device 218 to a fixed value in the manner described above. These components can be incorporated within the package outline of a power amplifier 206, 208. Alternatively, these components can be provided external to a device package, e.g., at the circuit board level using microstrip lines in combination with surface mountable components.

The output matching circuit 222 further includes a high-pass matching network 230. Commercial power devices, such as LDMOS or GaN devices, have a non-negligible output parasitic capacitance between the output terminals of the device, which is represented as $C_{DS}$ in FIG. 4. Moreover, the output bond wires that connect the outputs of the amplifier device 218 to the package level terminals have a non-negligible parasitic inductance, which is represented as $L_{Drain}$ in FIG. 4. These parasitic impedances $C_{DS}$ and $L_{Drain}$ create an LC circuit that shifts the impedance seen by the amplifier device 218 from the nominal Chireix impedance described with reference to FIG. 2 and degrade the efficiency of the amplifier. The high-pass matching network 230 is configured to create a resonant circuit with the output parasitic capacitance $C_{DS}$ at a center frequency of the RF signal so as to effectively transfer the RF signal to the output port. To this end, the high-pass matching network 230 includes a first inductor 232 that is arranged in a shunt configuration with respect to the output signal line of the amplifier 218. A first capacitor 234 is connected in series with the first inductor 232 to isolate DC current from ground.

Because the output matching circuit 222 is configured with a so-called "high-pass" network topology with a series matching network 228, it provides a ninety-degree phase shift in the amplified RF signal between the output of the amplifier device 218 (i.e., the intrinsic device reference plane) and the output terminal of the output matching circuit 222. This phase shift is depicted in FIG. 4. This ninety-degree phase shift means that the signal cannot be directly connected to the power combiner circuit 210 for proper recombination. That is, additional measures are required to ensure that the signals entering the power combiner circuit 210 are properly phase shifted for power recombination. One technique for ensuring proper phase shift involves using a quarter wave length transmission line to provide another phase shift. Referring again to the circuit of FIG. 3, for proper recombination of the amplified RF signal, an additional quarter wave length transmission line can be provided between the power amplifiers 206, 208 and the power combiner circuit 210. The resultant circuit includes a total phase shift of 270 degrees between the intrinsic device reference plane and the summing node 236 of the power combiner circuit 210. As a result, the circuit includes unnecessary delay and additional circuit elements that detrimentally increase power loss and lower efficiency.

Figure 5:
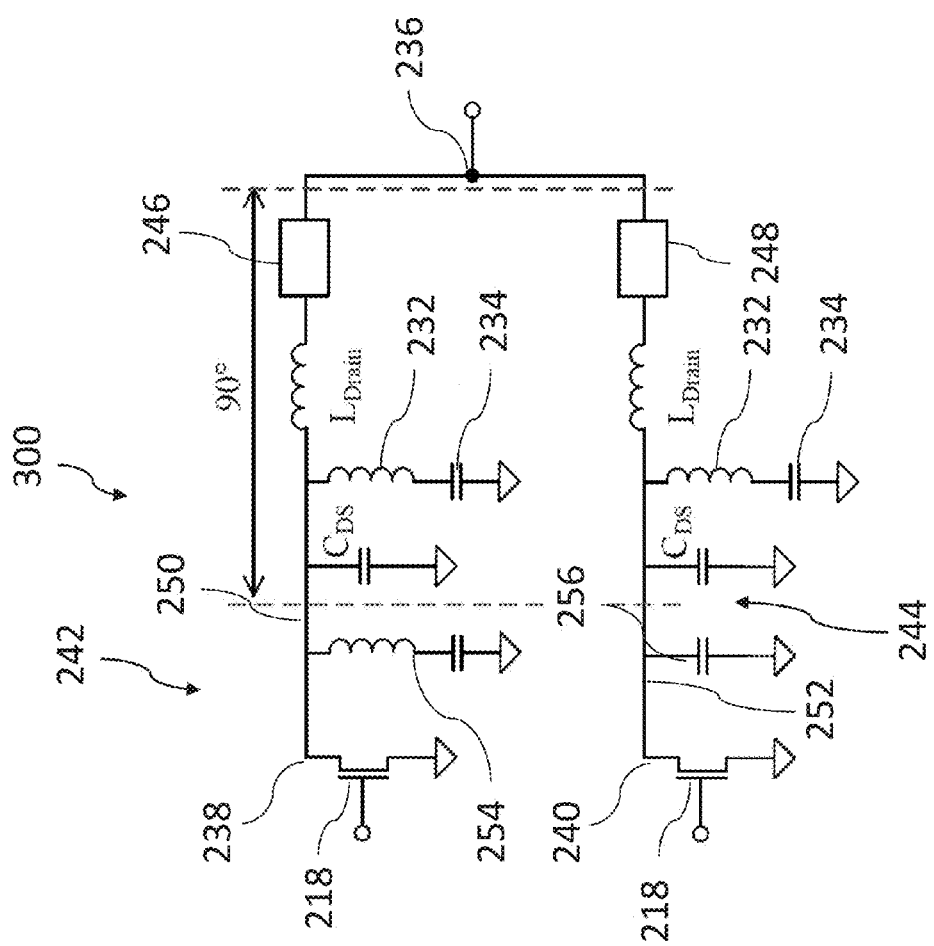
FIG. 5 depicts an output circuit that is configured to provide a load modulated impedance response and output impedance matching, according to an embodiment.

Referring to FIG. 5, an exemplary output circuit 300 is depicted, according to an embodiment. The output circuit 300 is configured to provide the Chireix combiner load modulated impedance response as shown in FIG. 2. In addition, the output circuit 300 is configured to provide the output matching functionality, including impedance matching, of the output matching circuit 222 described with reference to FIG. 4. Advantageously, the output circuit 300 provides the necessary phase shift for the outphasing operation and provides the impedance matching using common reactive components. That is, the output circuit 300 uses the same reactive components to produce a 90 phase shift between the combiner input reference plane and the summing node 236 that it uses to perform impedance matching. This is achieved by making dual use of the reactive components to provide the impedance match functionality of the output matching circuit 222 described with reference to FIG. 4 and the phase shift functionality of the quarter wave transmission lines 110, 112 described with reference to FIG. 1. In this way, the component count of the circuit can be reduced and 180 degrees of phase shift can be eliminated from the circuit.

The output circuit 300 is a three port network, with a first input port connected to the first output terminal 238 of the first amplifier device 218, a second input port connected to the second output terminal 240 of the second amplifier device 218, and an output port provided at the summing node 236. The output circuit 300 includes a first branch 242 that is connected between the first output terminal 238 and the summing node 236 and a second branch 244 that is connected between the second output terminal 240 and the summing node 236. The first branch 242 is configured to match an output impedance of the first amplifier 218 to a fixed impedance value (e.g., 50 ohms). From an input perspective of the three port network, the first branch 242 is configured to match an input impedance of the first port to a fixed value. Furthermore, the first branch 242 is configured to phase shift a first amplified RF signal that is provided by the first amplifier device 218 by ninety degrees between the combiner input reference plane and the summing node 236. The second branch 244 is configured to match an output impedance of the second amplifier 218 to a fixed impedance value and to phase shift the second amplified RF signal by ninety degrees between the combiner input reference plane and the summing node 236 in a corresponding manner.

The first and second branches 242, 244 include impedance matching networks. The first branch 242 includes a first LC network 250 connected between the first output terminal 238 and the summing node 236, a first inductor 232 and a first capacitor 234 that are connected in series with one another and arranged in a shunt configuration with respect to the first output terminal 238 and the summing node 236, and a first impedance matching network 246 connected between the first output terminal 238 and the summing node 236. Likewise, the second branch 244 includes a second LC network 252 connected between the first output terminal 238 and the summing node 236, a second inductor 232 and a second capacitor 234 that are connected in series with one another and arranged in a shunt configuration with respect to the second output terminal 240 and the summing node 236, and a second impedance matching network 248 connected between the second output terminal 240 and the summing node 236.

Each of the first and second first LC networks 250, 252 include the high-pass matching network 230 as described with reference to FIG. 4 as part of their topology. In the first LC network 250, the high-pass matching network 230 topology is provided by the first inductor 232 and the first capacitor 234. In the second LC network 252, the high-pass matching network 230 topology is provided by the second inductor 232 and the second capacitor 234.

The first and second LC networks 250, 252 further include reactive components that are in parallel with the high-pass matching networks 230. In the embodiment of FIG. 5, the first LC network 250 includes a third inductor 254 that is connected in parallel with the first inductor 232 and the first capacitor 234 of the first LC network 250. The second LC network 252 includes a third capacitor 256 that is connected in parallel with the second inductor 232 and the second capacitor 234 of the second LC network 252.

In addition to providing the output matching and resonating the $C_{DS}$ of the first and second amplifiers 218, a second purpose of the high-pass matching network topology of the first and second branches 242, 244 is to replicate the function of the quarter wave transmission lines 110, 112 from the combiner circuit 106 described with reference to FIG. 1. That is, the high-pass matching network 230 topology with the series inductors $L_{DRAIN}$ and 246, 248 is used to provide a ninety-degree phase shift of the first and second amplified RF signals. This can be achieved by appropriately tailoring the parameters of the high-pass matching network 230 and the impedance matching network so that the overall circuit collectively produces the ninety-degree phase shift. The efficiency compensation inductor 114 in the Chireix combiner circuit 106 described with reference to FIG. 1 is provided by the third inductor 254 and the efficiency compensation capacitor in the Chireix combiner circuit 106 described with reference to FIG. 1 is provided by the third capacitor 256. The parameters of the third inductor 254 and the third capacitor 256 are set to values that present the load modulated Chireix combiner impedance response to the first and second amplifiers 218, e.g., as depicted in FIG. 2.

By using the high-pass matching network topology after 254, 256 to phase shift the amplified signals, the overall phase shifts of the first and second amplified signals between the first and second output terminals, respectively, are kept to the necessary phase differences for outphasing according to input signal amplitudes.

Figure 6:
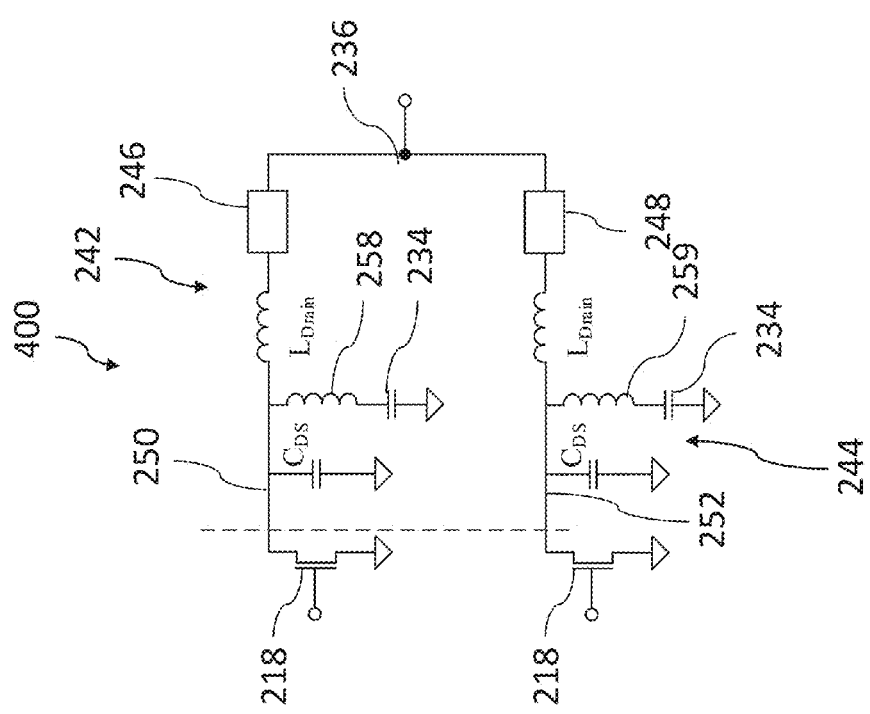
FIG. 6 depicts an output circuit that is configured to provide a load modulated impedance response and output impedance matching, according to another embodiment.

Referring to FIG. 6, an exemplary output circuit 400 is depicted, according to another embodiment. The embodiment of FIG. 6 can be substantially similar or identical to the embodiment of FIG. 5, except that in this case, the efficiency compensation components of the Chireix combiner described with reference to FIG. 1 have been incorporated into the first and second inductors 258, 259 of the first and second branches 242, 244. That is, rather than providing the efficiency compensation components as a discrete third inductor 254 in the first branch 242 and a discrete third capacitor 256 in the second branch 244, the impedance of these components is incorporated into the first and second inductors 258, 259 of the first and second branches 242, 244.

The combined inductance values of the first and second inductors 258, 259 of the first and second branches 242, 244 in the circuit of FIG. 6 can be derived using linear circuit analysis. The inductance $L_{t2}$ of the first inductor 258 of the first branch 242 can be determined according to the following equation:

$$L_{t2} = \frac{L_1\left(\omega L_t - \frac{1}{\omega C_{SH}}\right)}{\omega L_t - \frac{1}{\omega C_{SH}} + \omega L_1} + \frac{1}{\omega^2 C_{SH}}; \quad \text{Equation 1}$$

wherein $L_1$=the compensation inductance of the shunt inductor 254, $L_t$=the filtering inductance of the first inductor 232 in the first LC circuit 250, $C_{SH}$=the capacitance of the shunt capacitor 234 in the first LC circuit 250, and $\omega$=the angular frequency of the first amplified RF signal.

The inductance $L_{t3}$ of the second inductor 259 of the second branch 244 can be determined according to the following equation:

$$L_{t3} = \frac{\frac{1}{\omega^2 C_{SH}} - L_t}{\omega C_1\left(\omega L_t - \frac{1}{\omega C_{SH}}\right) - 1} + \frac{1}{\omega^2 C_{SH}}; \quad \text{Equation 2}$$

wherein $C_1$=the compensation capacitance of the shunt capacitor 256, $L_t$=the filtering inductance of the first inductor 232 in the second LC circuit 252, $C_{SH}$=the capacitance of the shunt capacitor 234 in the second LC circuit 252, and $\omega$=the angular frequency of the second amplified RF signal.

Advantageously the topology of FIG. 6 allows the first and second branch 242, 244 to provide the impedance matching, and Chireix combiner impedance response described herein with minimal component count.

Terms such as "same," "match," and "matches" as used herein are intended to mean identical, nearly identical, or approximately so that some reasonable amount of variation is contemplated without departing from the spirit of the invention. The term "constant" means not changing or varying, or changing or varying slightly again so that some reasonable amount of variation is contemplated without departing from the spirit of the invention. Further, terms such as "first," "second," and the like, are used to describe various elements, regions, sections, etc. and are also not intended to be limiting. Like terms refer to like elements throughout the description.

The term "directly electrically connected" or "electrically connected" describes a permanent low-ohmic connection between electrically connected elements: for example, a wire connection between the concerned elements. By contrast, the term "electrically coupled" means that one or more intervening element(s) configured to influence the electrical signal in some tangible way is provided between the electrically coupled elements. These intervening elements include active elements, such as transistors, as well as passive elements, such as inductors, capacitors, diodes, resistors, etc.

Spatially relative terms such as "under," "below," "lower," "over," "upper," and the like are used for ease of description to explain the positioning of one element relative to a second element. These terms are intended to encompass different orientations of the device in addition to different orientations than those depicted in the figures. Further, terms such as "first," "second," and the like are also used to describe various elements, regions, sections, etc. and are also not intended to be limiting. Like terms refer to like elements throughout the description.

As used herein, the terms "having," "containing," "including," "comprising," and the like are open ended terms that indicate the presence of stated elements or features, but do not preclude additional elements or features. The articles "a," "an," and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power amplifier, comprising:
   an outphasing amplifier, comprising:
   a first amplifier comprising a first output terminal; and
   a second amplifier comprising a second output terminal,
   wherein the outphasing amplifier is configured to provide a first amplified RF signal at the first output terminal and a second amplified RF signal at the second output terminal, the second amplified RF signal having the same frequency and being phase shifted from the first amplified RF signal;
   an output circuit being configured to combine RF power of the first and second amplified RF signals at a summing node, the output circuit comprising:
   a first branch connected between the first output terminal and the summing node, the first branch being configured to match an output impedance of the first amplifier to a fixed impedance value and to phase shift the first amplified RF signal for an outphasing operation using common reactive components for the match of the output impedance and the outphasing operation; and
   a second branch connected between the second output terminal and the summing node, second branch being configured to match an output impedance of the second amplifier to a fixed impedance value and to phase shift the second amplified RF signal for an outphasing operation using common reactive components for the match of the output impedance and the outphasing operation.

2. The power amplifier of claim 1, wherein the first branch comprises a first LC network connected between the first output terminal and the summing node, wherein the second branch comprises a second LC network connected between the second output terminal and the summing node, and wherein the first and second LC networks each comprise a high-pass matching network topology that is configured to resonate out an output parasitic capacitance of the first and second amplifiers.

3. The power amplifier of claim 2, wherein the first branch further comprises a first impedance matching network being configured to match the output impedance of the first amplifier to the fixed value, and wherein the second branch further comprises a second impedance matching network being configured to match the output impedance of the second amplifier to the fixed value.

4. The power amplifier of claim 3, wherein the first LC network and the first impedance matching network are configured to collectively phase shift the first amplified RF signal by ninety degrees at a center frequency of the first amplified RF signal, and wherein the second LC network and the second impedance matching network are configured to collectively phase shift the second amplified RF signal by ninety degrees at a center frequency of the second amplified RF signal.

5. The power amplifier of claim 4, wherein the first LC network comprises a first inductor and a first capacitor connected in series with one another, arranged in a shunt configuration with respect to the first output terminal and the summing node, and being configured to filter resonant components of the first amplified RF signal attributable to parasitic capacitance of the first amplifier, and wherein the second LC network comprises a second inductor and a second capacitor connected in series with one another, arranged in a shunt configuration with respect to the second output terminal and the summing node, and being configured to filter resonant components of the second amplified RF signal attributable to parasitic capacitance of the second amplifier.

6. The power amplifier of claim 5, wherein the first LC network comprises a first reactive efficiency compensation component arranged in a shunt configuration with respect to the first output terminal and the summing node, wherein the second LC network comprises a second reactive efficiency compensation component arranged in a shunt configuration with respect to the second output terminal and the summing node, wherein the first and second reactive efficiency compensation components are configured to optimize power efficiency of the output circuit across varying power levels of the first and second amplified RF signals.

7. The power amplifier of claim 6, wherein the first reactive efficiency compensation component is provided by a third inductor that is connected in parallel with the first inductor and the first capacitor, and wherein the second reactive efficiency compensation component is provided by a third capacitor that is connected in parallel with the second inductor and the second capacitor.

8. The power amplifier of claim 6, wherein the first reactive efficiency compensation component is incorporated into the first inductor, and wherein the second reactive efficiency compensation component is incorporated into the second inductor.

9. The power amplifier of claim 1, wherein the outphasing amplifier and the output circuit collectively form a Chireix amplifier, wherein the output circuit is configured as a power combiner for the Chireix amplifier, and wherein the output circuit is devoid of a quarter wave transmission line.

10. A Chireix combiner circuit being configured to combine RF power from first and second amplified RF signals that are equal in magnitude and opposite in phase, the Chireix combiner circuit comprising:
first and second input ports;
a summing node;
a first branch connected between the first input port and the summing node, the first branch comprising a first LC network and a first impedance matching network, the first impedance matching network being configured to match an input impedance of the first branch to a fixed value, the first impedance matching network and the first LC network being collectively configured to phase shift the first amplified RF signal for an outphasing operation using common reactive components for the match of the input impedance of the first branch and the outphasing operation; and
a second branch connected between the second input port and the summing node, the second branch comprising a second LC network and a second impedance matching network, the second impedance matching network being configured to match an input impedance of the second branch to a fixed value, the second impedance matching network and the second LC network being collectively configured to phase shift the second amplified RF signal for an outphasing operation using common reactive components for the match of the input impedance the second branch and the outphasing operation.

11. The Chireix combiner circuit of claim 10, wherein the first LC network comprises a first inductor and a first capacitor connected in series with one another, arranged in a shunt configuration with respect to the first input port and the summing node, and being configured to filter resonant components of the first amplified RF signal, and wherein the second LC network comprises a second inductor and a second capacitor connected in series with one another, arranged in a shunt configuration with respect to the second input port and the summing node, and being configured to filter resonant components of the second amplified RF signal.

12. The Chireix combiner circuit of claim 11, wherein the first LC network comprises a first reactive efficiency compensation component arranged in a shunt configuration with respect to the first input port and the summing node, wherein the second LC network comprises a second reactive efficiency compensation component arranged in a shunt configuration with respect to the second input port and the summing node, and wherein the first and second reactive efficiency compensation components are configured to optimize efficiency of the Chireix combiner circuit across varying power levels of the first and second amplified RF signals.

13. A method of amplifying an RF signal, comprising:
separating and amplifying the RF signal using first and second amplifiers into first and second amplified RF signals, the second amplified RF signal having the same frequency and being phase shifted from the first amplified RF signal;
feeding the first and second amplified RF signals into a combiner circuit, the combiner circuit comprising a first branch connected between a first output terminal of the first amplifier and a summing node and a second branch connected between a second output terminal of the second amplifier and the summing node, the first branch comprising a first LC network and a first output matching network being configured to match an input impedance of the first branch to an optimal load impedance of the first amplifier, the second branch comprising a second LC network and a second output matching network being configured to match an input impedance of the second branch to an optimal load impedance of the second amplifier; and
combining RF power from the first and second amplified RF signals into the summing node using the combiner circuit, wherein combining the RF power comprises phase shifting the first amplified RF signal for an outphasing operation between the first output node and the summing node using the first LC network and the first output matching network and phase shifting the second amplified RF signal for an outphasing operation between the second output node and the summing node using the second LC network and the second output matching network,
wherein the phase shifting of the first amplified RF signal for an outphasing operation between the first output node and the summing node is performed using common reactive components from the first output matching network, and
wherein the phase shifting of the second amplified RF signal for an outphasing operation between the second output node and the summing node is performed using common reactive components from the second output matching network.

14. The method of claim 13, wherein the first LC network comprises a first inductor and a first capacitor connected in series with one another and arranged in a shunt configuration with respect to the first output terminal and the summing node, wherein the second LC network comprises a second inductor and a second capacitor connected in series with one another and arranged in a shunt configuration with respect to the second output terminal and the summing node, the method further comprising:
filtering resonant components of the first amplified RF signal attributable to parasitic capacitance of the first amplifier using the first inductor and the first capacitor; and
filtering resonant components of the second amplified RF signal attributable to parasitic capacitance of the second amplifier using the second inductor and the second capacitor.

15. The method of claim 14, further comprising using a first reactive efficiency compensation component that is arranged in a shunt configuration with respect to the first output terminal and the summing node and a second reactive efficiency compensation component that is arranged in a shunt configuration with respect to the second output terminal and the summing node to optimize efficiency of the combiner circuit across varying power levels of the first and second amplified RF signals.

16. The method of claim 15, wherein using the first reactive efficiency compensation component comprises using a third inductor that is connected in parallel with the first inductor and the first capacitor, and wherein using the second reactive efficiency compensation component comprises using a third capacitor that is connected in parallel with the second inductor and the second capacitor.

17. The method of claim 15, wherein using the first reactive efficiency compensation component comprises using the first inductor, and wherein using the second reactive efficiency compensation component comprises using the second inductor.

18. The power amplifier of claim 1, wherein the output circuit is devoid of a quarter wave transmission line.

19. The Chireix combiner circuit of claim 10, wherein the first branch comprises a first LC network connected between the first output terminal and the summing node, wherein the second branch comprises a second LC network connected between the second output terminal and the summing node, and wherein the first and second LC networks each comprise a high-pass matching network topology that is configured to resonate at an output parasitic capacitance of first and second amplifiers.

20. The method of claim 13, wherein the first branch comprises a first LC network connected between the first output terminal and the summing node, wherein the second branch comprises a second LC network connected between the second output terminal and the summing node, and wherein the first and second LC networks each comprise a high-pass matching network topology that is configured to resonate at an output parasitic capacitance of the first and second amplifiers during the amplification of the RF signal.

* * * * *